United States Patent
Park et al.

(10) Patent No.: US 9,087,590 B2
(45) Date of Patent: Jul. 21, 2015

(54) NONVOLATILE MEMORY DEVICE AND METHOD OF PROGRAMMING THE SAME

(71) Applicant: Samsung Electronics Co., Ltd., Suwon-si (KR)

(72) Inventors: Il-Han Park, Suwon-si (KR); Go-Eun Jung, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 46 days.

(21) Appl. No.: 13/970,462

(22) Filed: Aug. 19, 2013

(65) Prior Publication Data

US 2014/0119122 A1    May 1, 2014

(30) Foreign Application Priority Data

Oct. 30, 2012  (KR) .................. 10-2012-0121491

(51) Int. Cl.
| | |
|---|---|
| *G11C 7/10* | (2006.01) |
| *G11C 16/10* | (2006.01) |
| *G11C 16/04* | (2006.01) |
| *G11C 16/08* | (2006.01) |
| *G11C 16/34* | (2006.01) |

(52) U.S. Cl.
CPC ............ *G11C 16/10* (2013.01); *G11C 16/0483* (2013.01); *G11C 16/08* (2013.01); *G11C 16/3427* (2013.01)

(58) Field of Classification Search
CPC ..... G11C 7/1006; G11C 7/1051; G11C 7/1078
USPC ............. 365/189.02, 185.17, 189.05, 230.08, 365/185.14
See application file for complete search history.

(56) References Cited

U.S. PATENT DOCUMENTS

| | | | |
|---|---|---|---|
| 7,527,024 B2 | 5/2009 | Hosoda | |
| 7,924,619 B2 | 4/2011 | Aritome | |
| 2008/0304324 A1 | 12/2008 | Nagashima et al. | |
| 2011/0157995 A1 | 6/2011 | Bicksler | |
| 2011/0182117 A1* | 7/2011 | Yang et al. | ............... 365/185.02 |
| 2011/0305088 A1 | 12/2011 | Huang | |

* cited by examiner

Primary Examiner — Jason Lappas
(74) Attorney, Agent, or Firm — Muir Patent Law, PLLC

(57) ABSTRACT

A nonvolatile memory device and a method of programming the nonvolatile semiconductor memory device are disclosed. The programming method includes applying a first voltage greater than a ground voltage to a selected word line at a first time; applying a second voltage greater than the first voltage to the selected word line at a second time that occurs after a predetermined period from the first time; applying the ground voltage to a first unselected word line directly adjacent to the selected word line at the first time; and applying a third voltage greater than the ground voltage to the first unselected word line at the second time.

19 Claims, 13 Drawing Sheets

NONVOLATILE MEMORY DEVICE AND METHOD OF PROGRAMMING THE SAME

CROSS-REFERENCE TO RELATED APPLICATION

This application claims priority under 35 U.S.C. §119 to Korean Patent Application No. 10-2012-0121491 filed on Oct. 30, 2012, the disclosure of which is hereby incorporated by reference in its entirety.

BACKGROUND

This disclosure relates to a method of programming a nonvolatile semiconductor memory device and, more particularly, to a method of programming a NAND-type flash memory device.

Semiconductor memory devices may be largely classified into volatile semiconductor memory devices and nonvolatile semiconductor memory devices. A volatile semiconductor memory device may store data due to a logic state of a bistable flip-flop or the charging or discharging of a capacitor. The volatile semiconductor memory device may store or read data when a power is supplied and lose the stored data when the power is interrupted.

A nonvolatile semiconductor memory device, such as an electrically erasable programmable read-only-memory (EEPROM), may store data even if power is interrupted. The nonvolatile semiconductor memory device may be used to store programs and data in a wide range of applications, such as computers and communication devices. Since an EEPROM is electrically erasable and programmable, the EEPROM is being widely used as a system programming device or auxiliary memory device that may need to be continuously updated. Among flash memory devices, a NAND-type flash memory device may be more highly integrated than a NOR-type flash memory device.

The NAND-type flash memory device may include a memory cell array to store data, and the memory cell array may include a plurality of cell strings (also called NAND strings). A memory cell of the NAND-type flash memory device may perform erase and program operations using a Fowler-Nordheim (F-N) tunneling current.

In general, an increase in storage capacity may reduce a program performance due to wide threshold voltage distribution of memory cells in the memory cell array. Accordingly, it is desirable to control a threshold voltage distribution of memory cells in order to improve the program performance.

SUMMARY

Embodiments of the disclosure provide a nonvolatile semiconductor memory device having a uniform programming speed with respect to memory cells.

Embodiments of the disclosure also provide a method of programming a nonvolatile semiconductor memory device having a uniform programming speed with respect to memory cells.

In one embodiment, a nonvolatile memory device includes a memory cell array and a row control circuit.

The memory cell array includes a plurality of memory cells connected to word lines, string selection lines, ground selection lines arranged side by side in a row direction, and bit lines arranged in a direction perpendicular to the word lines. The row control circuit is configured to: generate a program voltage, a first pass voltage, and a second pass voltage; control the word lines, the string selection lines, and the ground selection lines; and apply the program voltage to a selected word line a predetermined time after the first pass voltage is applied to the selected word line, and apply the second pass voltage to an unselected word line directly adjacent to the selected word line when the program voltage is applied to the selected word line.

In one embodiment, a method of programming a nonvolatile semiconductor memory device is provided. The nonvolatile semiconductor memory device includes a memory cell array including a plurality of memory cells connected to word lines, string selection lines, and ground selection lines arranged side by side in a row direction, and bit lines arranged in a direction perpendicular to the word lines. The method includes: at a selected word line at a first time, transitioning to a first pass voltage having a first voltage level greater than a ground voltage; at the selected word line at a second time, transitioning to a program voltage having a second voltage level greater than the first voltage level; and at a first unselected word line directly adjacent to the selected word line at the second time, transitioning to a second pass voltage having a third voltage level greater than the ground voltage.

In one embodiment, a method of programming a nonvolatile semiconductor memory device is provided. The method includes: applying a first voltage greater than a ground voltage to a selected word line at a first time; applying a second voltage greater than the first voltage to the selected word line at a second time that occurs after a predetermined period from the first time; applying the ground voltage to a first unselected word line directly adjacent to the selected word line at the first time; and applying a third voltage greater than the ground voltage to the first unselected word line at the second time.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
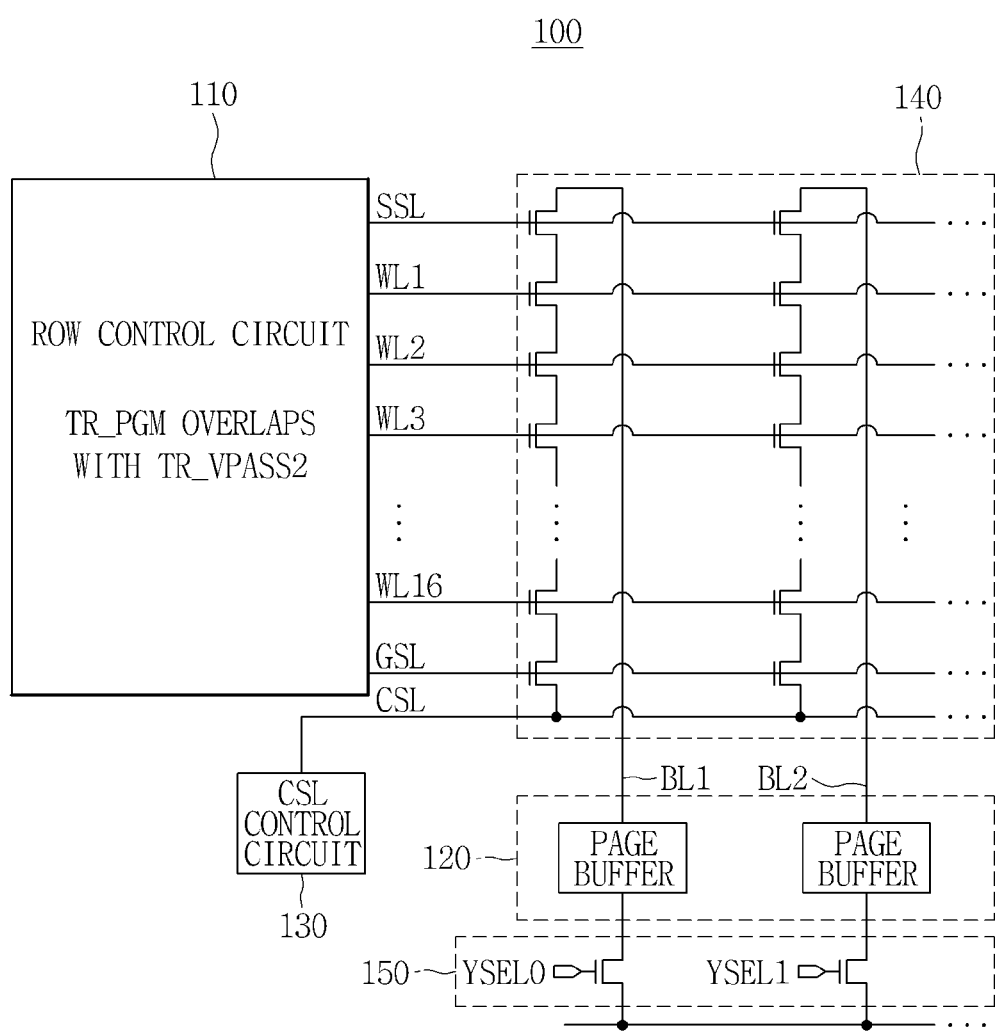
FIG. 1 is a block diagram of a NAND-type flash memory device according to certain embodiments.

Various exemplary embodiments will be described more fully hereinafter with reference to the accompanying drawings, in which some exemplary embodiments are shown. The invention may, however, be embodied in many different forms and should not be construed as limited to the embodiments set forth herein. In the drawings, the sizes and relative sizes of layers and regions may be exaggerated for clarity. Like numerals refer to like elements throughout.

The terminology used herein should be understood as follows.

It will be understood that, although the terms first, second, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the present disclosure may be performed otherwise. That is, the respective steps may be performed in a specified order, substantially at the same time, or in reverse order.

Hereinafter, a method of programming a nonvolatile semiconductor memory device according to some exemplary embodiments will be described with reference to the appended drawings.

FIG. 1 is a block diagram of a NAND-type flash memory device 100 according to certain embodiments.

Referring to FIG. 1, a NAND-type flash memory device 100 may include a row control circuit 110, a page buffer circuit 120, a common source line control circuit 130, a memory cell array 140 and a column gate circuit 150.

In one embodiment, the row control circuit 110 may generate a program voltage VPGM, a first pass voltage VPASS1, a second pass voltage VPASS2 and a string selection voltage VSSL. The string selection voltage VSSL may have a voltage level higher than a threshold voltage of a selected string selection transistor and lower than a threshold voltage of an unselected string selection transistor. The row control circuit 110 may control electric potentials of word lines WL1 to WL16, a string selection line SSL, and a ground selection line GSL.

In the memory cell array 140, the word lines WL1 to WL16, the string selection line SSL, the ground selection line GSL, and a common source line CSL may be arranged side by side in a row direction, and bit lines BL1 and BL2 may be arranged in a direction perpendicular to the word lines WL1 to WL16.

The page buffer circuit 120 may include page buffers corresponding to the respective bit lines BL1 and BL2, and each of the page buffers may include a sense amplifier. In a read mode, each of the page buffers may function to sense data from a selected memory cell and transmit the sensed data through the column gate circuit 150 to an input/output (I/O) circuit (not shown). In a program mode, each of the page buffers may temporarily store the data applied through the I/O circuit and the column gate circuit 150. For example, each of the page buffers may function as both a data sensor and a latch. The column gate circuit 150 may electrically connect or disconnect the page buffer circuit 120 to or from the I/O circuit in response to column selection signals YSEL0 and YSEL1. The common source line control circuit 130 may control the electric potential of the common source line CSL in the program mode.

In the NAND-type flash memory device 100 of FIG. 1, in one embodiment, the program voltage VPGM and the first pass voltage VPASS1 may be parts of a signal applied to a selected word line in a program mode. The second pass voltage VPASS2 is part of a signal applied to an unselected word line in a program mode. For example, each of the signals may include a rising time period during which a voltage transitions from a first voltage level to a second predetermined voltage level such as VPGM, VPASS1, VPASS2, etc. The first pass voltage VPASS1 is part of a signal applied to the selected word line that includes a first rising time period, during which the voltage level of the selected word line reaches the first pass voltage VPASS1 from a ground voltage. The program voltage VPGM is part of the signal applied to the selected word line that includes a second rising time period, during which the voltage level of the selected word line reaches the program voltage from the first pass voltage VPASS1. The second pass voltage VPASS2 is part of a signal applied to the unselected word line directly adjacent to the selected word line that includes a third rising time period, during which the voltage level of the unselected word line directly adjacent to the selected word line reaches the second pass voltage VPASS2 from the ground voltage. For example, the second rising time period of the signal applied to the selected word line may overlap the third rising time period of the signal applied to the unselected word line directly adjacent to the selected word line. Therefore, in the NAND-type flash memory device 100, a parasitic capacitance between the selected word line and the unselected word line directly adjacent to the selected word line may be decreased. Accordingly, a transmission speed of the program voltage signal transmitted to memory cells of the memory cell array 140 becomes high. Further, distribution of a threshold voltage according to locations of memory cells in the memory cell array 140 becomes uniform. Accordingly, a program performance of the NAND-type flash memory device 100 may be improved.

Figure 2:
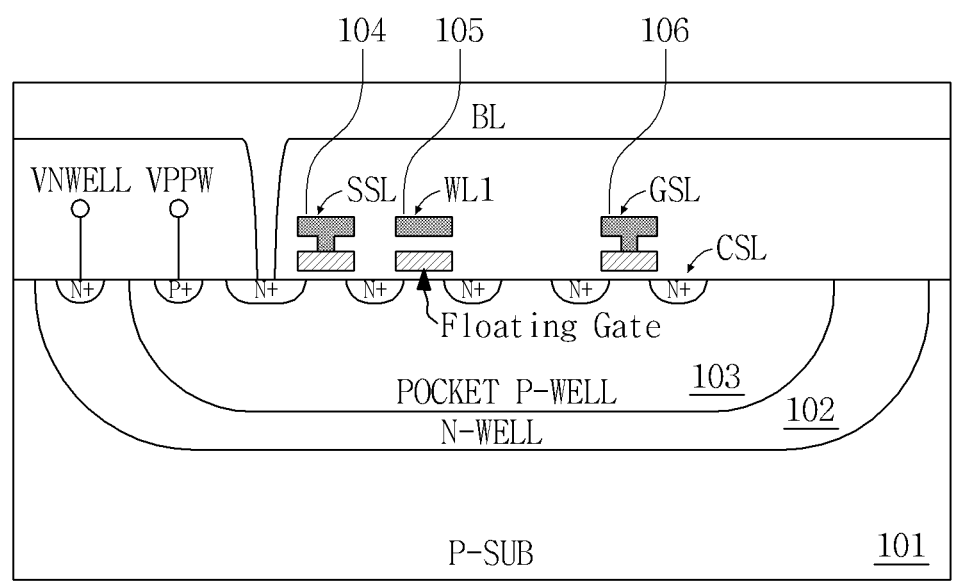
FIG. 2 is a cross-sectional view illustrating a vertical structure of the memory cell array of the NAND-type flash memory device of FIG. 1 according to an embodiment.

FIG. 2 is a cross-sectional view illustrating a vertical structure of the memory cell array of the NAND-type flash memory device of FIG. 1. In FIG. 2, one of the strings included in the memory cell array 140 is shown.

Referring to FIG. 2, an n-well region (N-WELL) 102 may be formed in a p-type substrate (P-SUB) 101, and a pocket p-well region (POCKET P-WELL) 103 may be formed in the n-well region 102. A floating gate transistor 105 having n-type source and drain regions, a string selection transistor 104, and a ground selection transistor 106 may be formed in the pocket p-well region 103. A gate of the string selection transistor 104 may be connected to the string selection line SSL, a gate of the ground selection transistor 106 may be connected to the ground selection line GSL, and a control gate of the floating gate transistor 105 may be connected to a first word line WL1.

The pocket p-well region may be biased at the pocket p-well bias voltage VPPW, and the n-well region 102 may be biased at the n-well bias voltage VNWELL.

Figure 3:
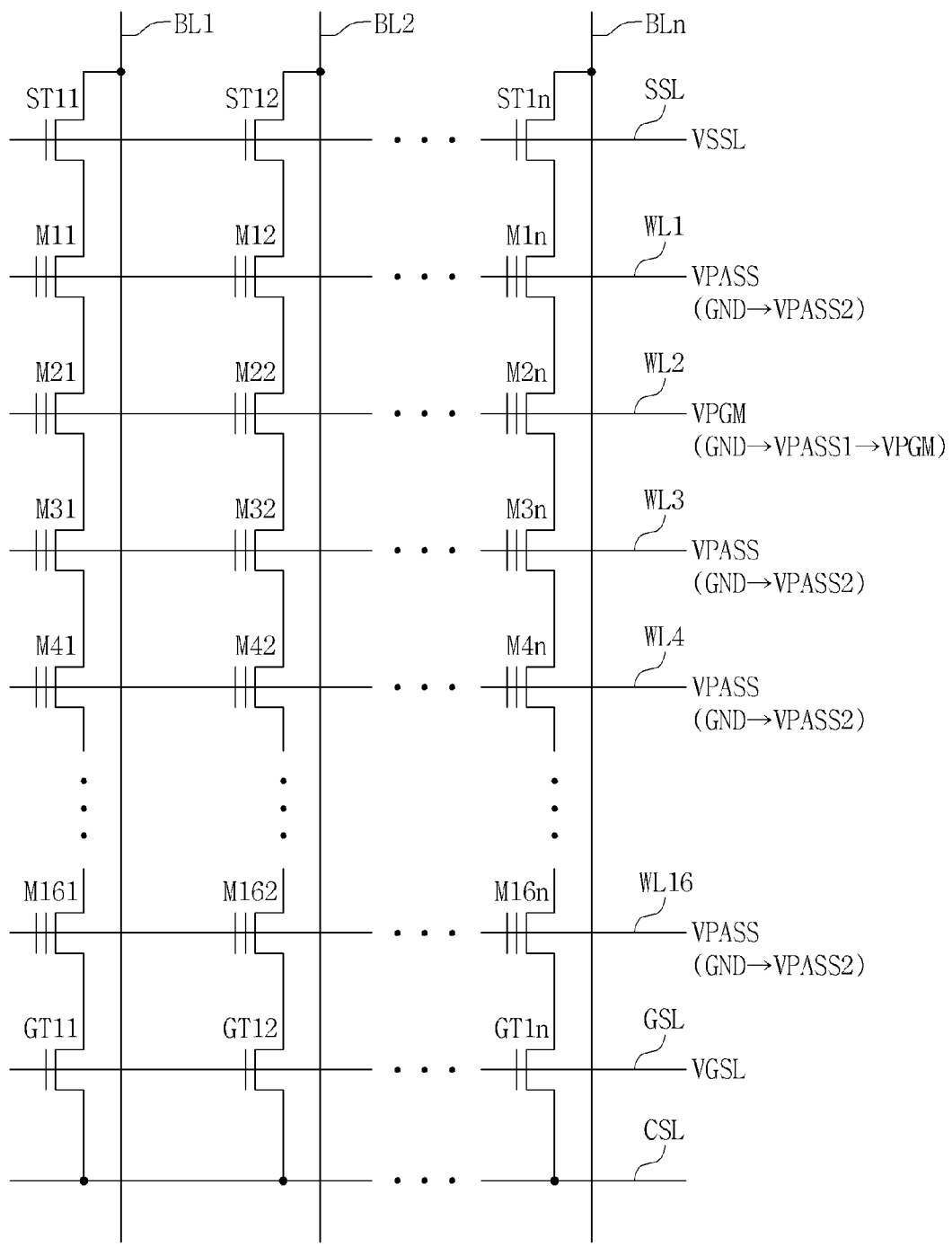
FIG. 3 is a circuit diagram of the memory cell array of the NAND-type flash memory device of FIG. 1 according to an embodiment.

FIG. 3 is a circuit diagram of the memory cell array of the NAND-type flash memory device of FIG. 1 according to an embodiment.

Referring to FIG. 3, the memory cell array 140 may include string selection transistors ST11 to ST1$n$, ground selection transistors GT11 to GT1$n$, and memory transistors M11 to M16$n$, which may be coupled to bit lines BL1 to BLn, a string selection line SSL, a ground selection line GSL, and word lines WL1 to WL16.

For example, accumulation of electrons in a floating gate may be defined as a program operation, and emission of the electrons accumulated in the floating gate into a channel may be defined as an erase operation. In this case, when the program operation begins, a threshold voltage VTH may increase. That is, when the memory device is programmed as data "0" due to the accumulation of electrons, the threshold voltage VTH may be increased, while when the memory device is programmed as data "1" due to the emission of electrons, the threshold voltage VTH may be maintained the same as when the memory device is erased.

In the memory cell array 140 of FIG. 3, a program voltage VPGM may be applied to a selected word line WL2 coupled to a memory transistor M21 to be programmed, and a pass voltage VPASS may be applied to unselected word lines W1 and WL3 to WL16. In the program mode, a string selection voltage VSSL having a voltage level higher than the threshold voltage VTH1 of the string selection transistor connected to the selected bit line and lower than the threshold voltage VTH2 of the unselected string selection transistor may be applied to the string selection line SSL.

The selected word line is a word line connected to a cell transistor to be programmed, and the unselected word line is a word line connected to a cell transistor not to be programmed.

The string selection voltage VSSL having a voltage level higher than the threshold voltage VTH1 of the string selection transistor connected to the selected bit line and lower than the threshold voltage VTH2 of the unselected string selection transistor may be applied to the string selection transistors ST11 to ST1$n$ connected to a common gate. The program voltage VPGM is applied to a selected word line a predetermined time after a first pass voltage VPASS1 is applied. A second pass voltage VPASS2 is applied to an unselected word line WL1 and WL3 directly adjacent to the selected word line WL2 when the program voltage VPGM is applied to the selected word line WL2. The second pass voltage VPASS2 may be applied to an unselected word line WL4 to WL16 that is not directly adjacent to the selected word line WL2 when the program voltage VPGM is applied to the selected word line WL2. Further, the second pass voltage VPASS2 may be applied to an unselected word line WL4 to WL16 that is not directly adjacent to the selected word line WL2 when the first pass voltage VPASS1 is applied to the selected word line WL2.

Figure 4:
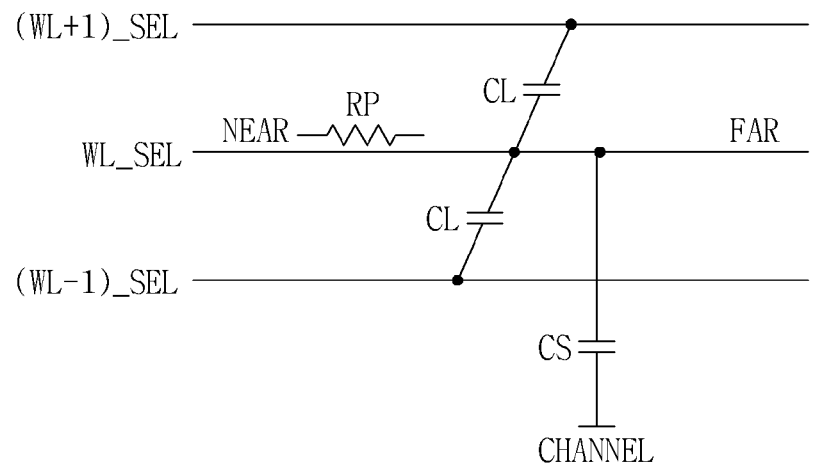
FIG. 4 is a diagram illustrating components of parasitic devices generated between a selected word line and word lines adjacent to the selected word line in a NAND-type flash memory device.

FIG. 4 is a diagram illustrating components of parasitic devices generated between a selected word line and word lines adjacent to the selected word line in a NAND-type flash memory device.

Referring to FIG. 4, a selected word line WL_SEL may include a parasitic resistance RP. Further, a parasitic capacitance CL may be included between the selected word line WL_SEL and an adjacent word line (WL+1)_SEL and between the selected word line WL_SEL and an adjacent word line (WL−1)_SEL. In addition, a parasitic capacitance CS may be included between the selected word line WL_SEL and a channel of a memory cell.

Figure 5:
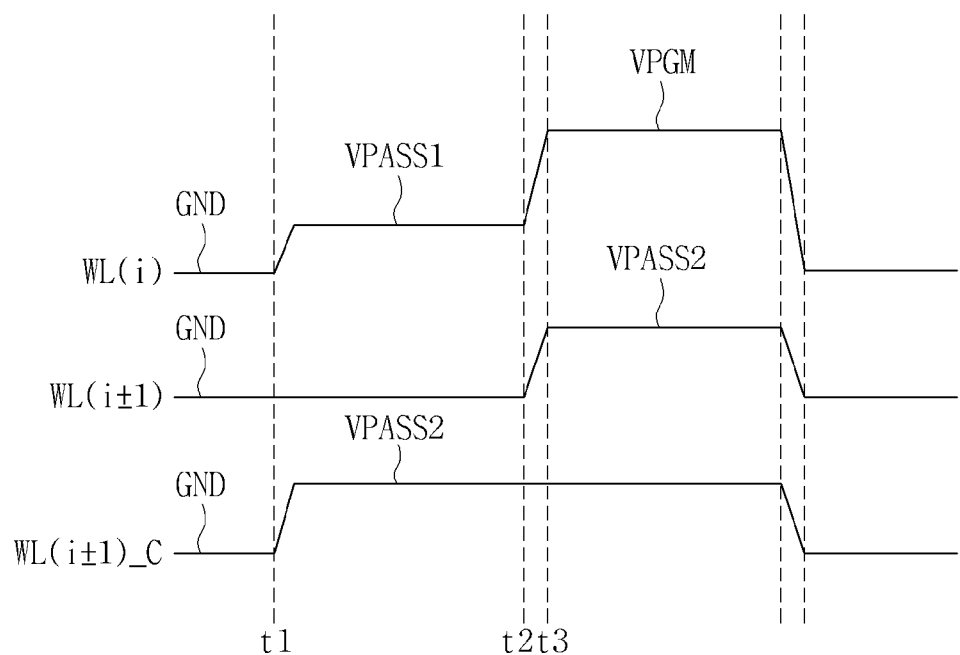
FIG. 5 is a diagram illustrating voltages applied to a selected word line and unselected word lines adjacent to the selected word line when the NAND-type flash memory device of FIG. 1 is programmed according to an embodiment.

FIG. 5 is a diagram illustrating voltages applied to a selected word line and unselected word lines adjacent to the selected word line when the NAND-type flash memory device of FIG. 1 is programmed according to an embodiment.

Referring to FIG. 5, a ground voltage GND is applied to the selected word line WL(i) and then the first pass voltage VPASS1 is applied to the selected word line WL(i) at time t1, and then the program voltage VPGM is applied to the selected word line WL(i) at time t2. The ground voltage GND is applied to unselected word lines WL(i±1) which are directly adjacent to the selected word line WL(i), and then the second pass voltage VPASS2 is applied to the unselected word lines WL(i±1) at time t2. In the conventional art, the ground voltage GND is applied to unselected word lines WL(i±1)_C which are directly adjacent to the selected word line WL(i), and then the second pass voltage VPASS2 is applied to the unselected word lines WL(i±1)_C at t1, and then the second pass voltage VPASS2 is maintained until time t2.

For example, in one embodiment, the first pass voltage VPASS1 is part of a signal applied to the selected word line WL(i) that includes a first rising time period, during which the voltage level of the selected word line WL(i) reaches the first pass voltage VPASS1 from a ground voltage. The program voltage VPGM is part of the signal applied to the selected word line WL(i) that includes a second rising time period (e.g., t2-t3), during which the voltage level of the selected word line WL(i) reaches the program voltage from the first pass voltage VPASS1. The second pass voltage VPASS2 is part of a signal applied to the unselected word line WL(i±1) directly adjacent to the selected word line WL(i) that includes a third rising time period (e.g., t2-t3), during which the voltage level of the unselected word line WL(i±1) directly adjacent to the selected word line WL(i) reaches the second pass voltage VPASS2 from the ground voltage.

Therefore, in the NAND-type flash memory device 100 of FIG. 1, the second rising time period of the signal applied to the selected word line WL(i) may overlap the third rising time period of the signal applied to the unselected word line WL(i±1). In this case, the second and third rising time periods are not limited to the exact same period. For example, some portions of the second and third rising time periods may overlap. Therefore, in the time period t2-t3 before program is executed on memory cells connected to the selected word line WL(i), a change of the electric potential difference between the selected word line and the unselected word line directly adjacent to the selected word line WL(i) may be decreased. Therefore, the amount of charge variation between the selected word line and the unselected word line directly adjacent to the selected word line WL(i) may be decreased. Therefore, a parasitic capacitance between the selected word line and the unselected word line directly adjacent to the selected word line WL(i) may be decreased.

Accordingly, a transmission speed of the program voltage VPGM transmitted to memory cells of a memory cell array becomes high in the program mode. Further, distribution of a threshold voltage according to locations of memory cells in the memory cell array becomes uniform. Accordingly, a program performance of the NAND-type flash memory device 100 may be improved.

Figure 6:
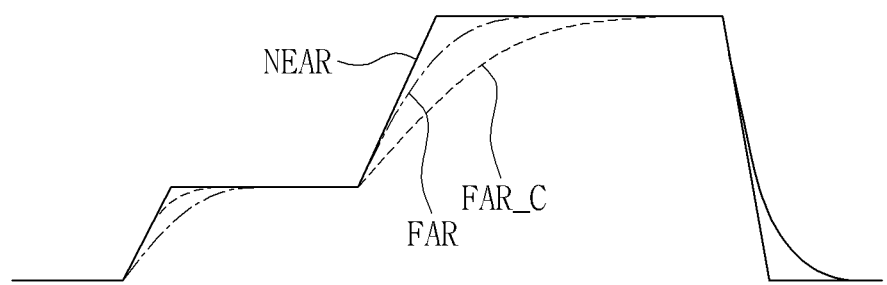
FIG. 6 is a diagram illustrating voltage waveforms of a selected word line according to a distance from a row control circuit when the NAND-type flash memory device of FIG. 1 is programmed according to an embodiment.

FIG. 6 is a diagram illustrating voltage waveforms of a selected word line according to a distance from a row control circuit when the NAND-type flash memory device of FIG. 1 is programmed according to an embodiment.

Referring to FIG. 6, in a selected word line NEAR located near the row control circuit 110 that supplies the program voltage VPGM, the first pass voltage VPASS1 and the second pass voltage VPASS2, the first pass voltage VPASS1 and the program voltage VPGM are transmitted at a high speed between the selected word line NEAR and the row control circuit 110. In the NAND-type flash memory device 100 according to embodiments, it is noted that even in a selected word line FAR located far from the row control circuit 110, the first pass voltage VPASS1 and the program voltage VPGM are transmitted at a high speed between the selected word line FAR and the row control circuit 110. However, in the conventional NAND-type flash memory device, it is noted that in a selected word line FAR_C located far from the row control circuit, the first pass voltage VPASS1 and the program voltage VPGM are transmitted at a low speed between the selected word line FAR_C and the row control circuit.

Figure 7:
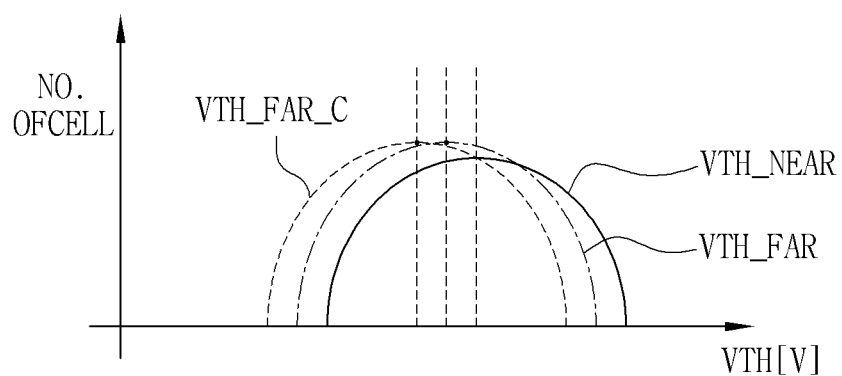
FIG. 7 is a diagram illustrating voltage waveforms of a threshold voltage of selected word lines according to a distance from a row control circuit when the NAND-type flash memory device of FIG. 1 is programmed according to an embodiment.

FIG. 7 is a diagram illustrating voltage waveforms of a threshold voltage of selected word lines according to a distance from a row control circuit when the NAND-type flash memory device of FIG. 1 is programmed according to an embodiment.

Referring to FIG. 7, it is noted that, in the conventional art, memory cells connected to a selected word line located far from the row control circuit has a threshold voltage distribution VTH_FAR_C which is lower than a threshold voltage distribution VTH_NEAR of memory cells connected to a selected word line located near the row control circuit. In the NAND-type flash memory device 100 according to embodiments, it is noted that memory cells connected to a selected word line located far from the row control circuit has a similar threshold voltage distribution VTH_FAR to a threshold voltage distribution VTH_NEAR of a memory cell connected to a selected word line located near the row control circuit, because a parasitic capacitance between the selected word line and an unselected word line directly adjacent to the selected word line is decreased.

Figure 8:
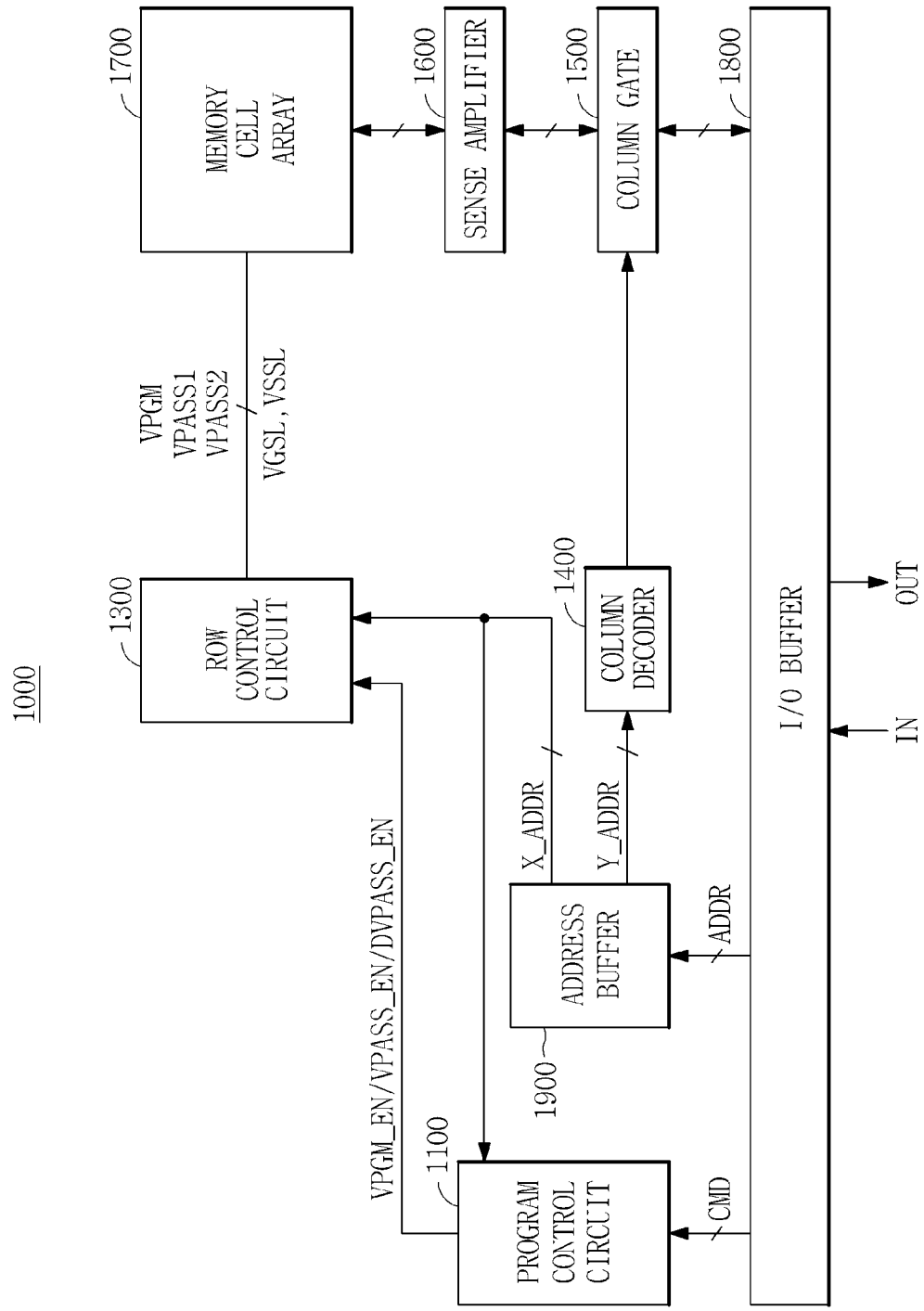
FIG. 8 is a block diagram of a NAND-type flash memory device according to other embodiments.

FIG. 8 is a block diagram of a NAND-type flash memory device according to other embodiments.

Referring to FIG. 8, a NAND-type flash memory device 1000 may include a program control circuit 1100, a row control circuit 1300, and a memory cell array 1700.

The memory cell array 1700 may include a plurality of cell transistors. The program control circuit 1100 may generate a program voltage enable signal VPGM_EN and a pass voltage enable signal VPASS_EN in response to a command signal CMD and a row address signal X_ADDR. The row control circuit 1300 may generate a program voltage VPGM, a first pass voltage VPASS1, a second pass voltage VPASS2, a string selection voltage VSSL and a ground selection voltage VGSL based on the row address signal X_ADDR, the program voltage enable signal VPGM_EN and a pass voltage enable signal VPASS_EN. The program voltage VPGM, the first pass voltage VPASS1, and the second voltage VPASS2 may be transmitted to word lines coupled to the memory cell array 1700.

Further, the NAND-type flash memory device 1000 may further include an address buffer 1900, a column decoder 1400, a column gate 1500, and a sense amplifier 1600.

The address buffer 1900 may buffer an address ADDR and generate the row address X_ADDR and a column address Y_ADDR. The column decoder 1400 may decode the column address Y_ADDR and generate the decoded column address. The column gate 1500 may transmit externally received first data and transmit externally output second data in response to the decoded column address. The sense amplifier 1600 may amplify output data of the memory cell array 1700, transmit the amplified data to the column gate 1500, receive output data of the column gate 1500, and transmit the received data to the memory cell array 1700.

Further, the NAND-type flash memory device 1000 may further include an input/output (I/O) buffer 1800, which may externally receive a command CMD, an address ADDR, and data, buffer the received command CMD, address ADDR, and data, transmit the buffered command CMD, address ADDR, and data to an internal circuit, receive data from the internal circuit, buffer the received data, and externally output the buffered data.

The memory cell array 1700 included in the flash memory device 1000 of FIG. 8 may have the same structure as the memory cell array of FIG. 3.

Therefore, in the NAND-type flash memory device 1000, the rising time period of the signal applied to the selected word line may overlap the rising time period of the signal applied to the unselected word line directly adjacent to the selected word line. Therefore, a parasitic capacitance between the selected word line and the unselected word line directly adjacent to the selected word line may be decreased. Further, distribution of a threshold voltage according to locations of memory cells in the memory cell array becomes uniform. Accordingly, a program performance of the NAND-type flash memory device 100 may be improved.

Figure 9:
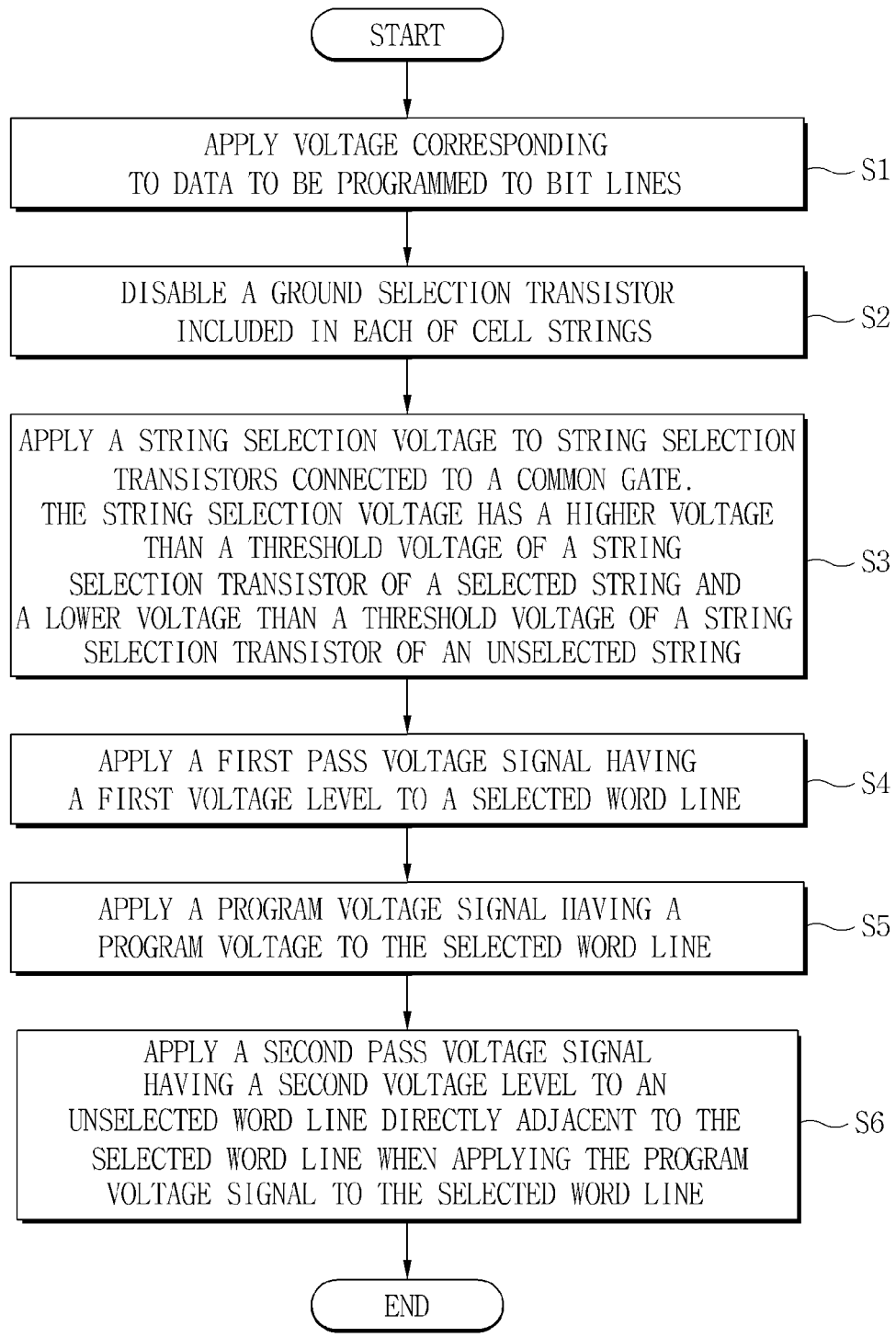
FIGS. 9 to 11 are flowcharts illustrating a method of programming a NAND-type flash memory device according to certain embodiments.
Figure 10:
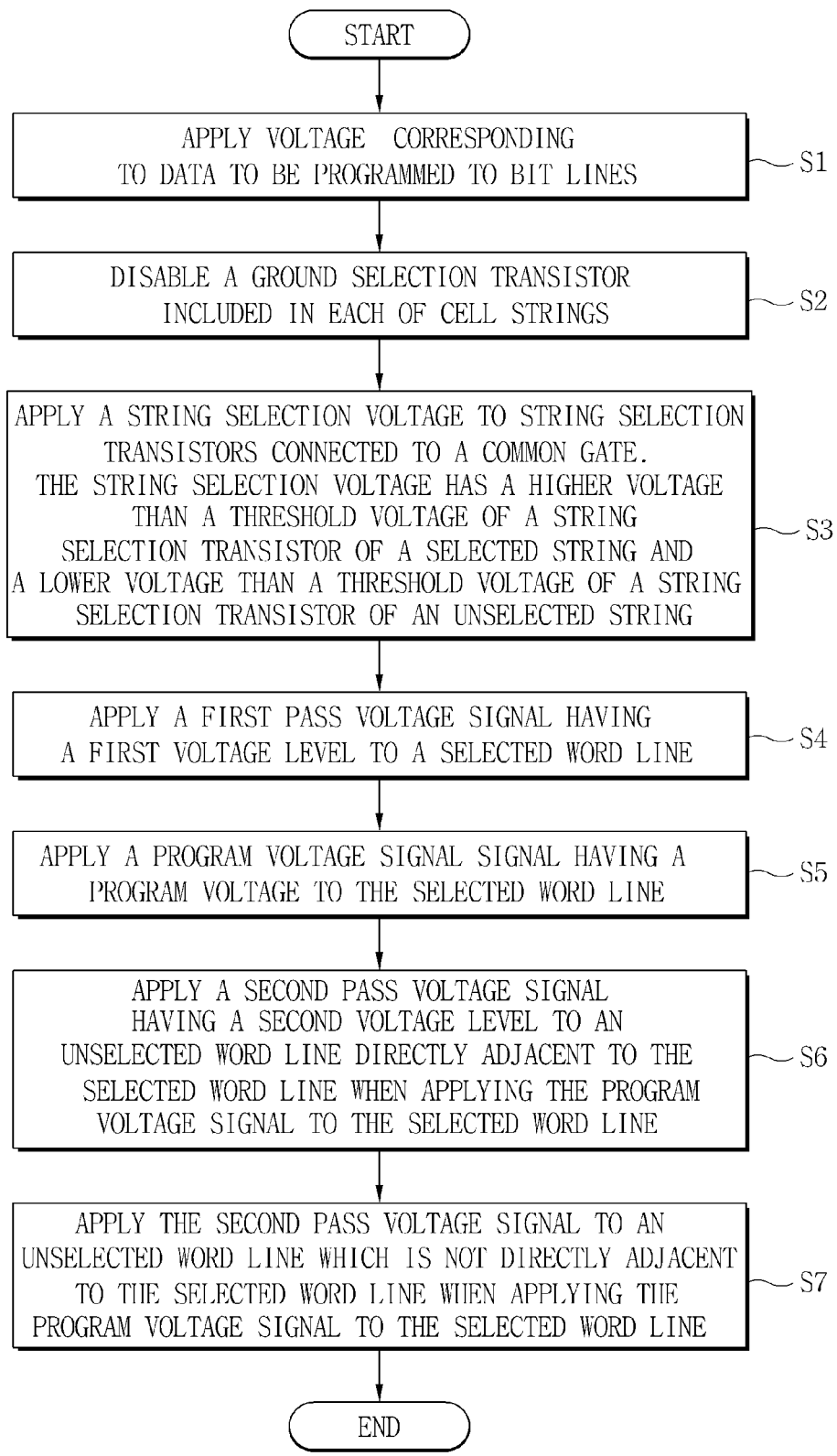
Figure 11:
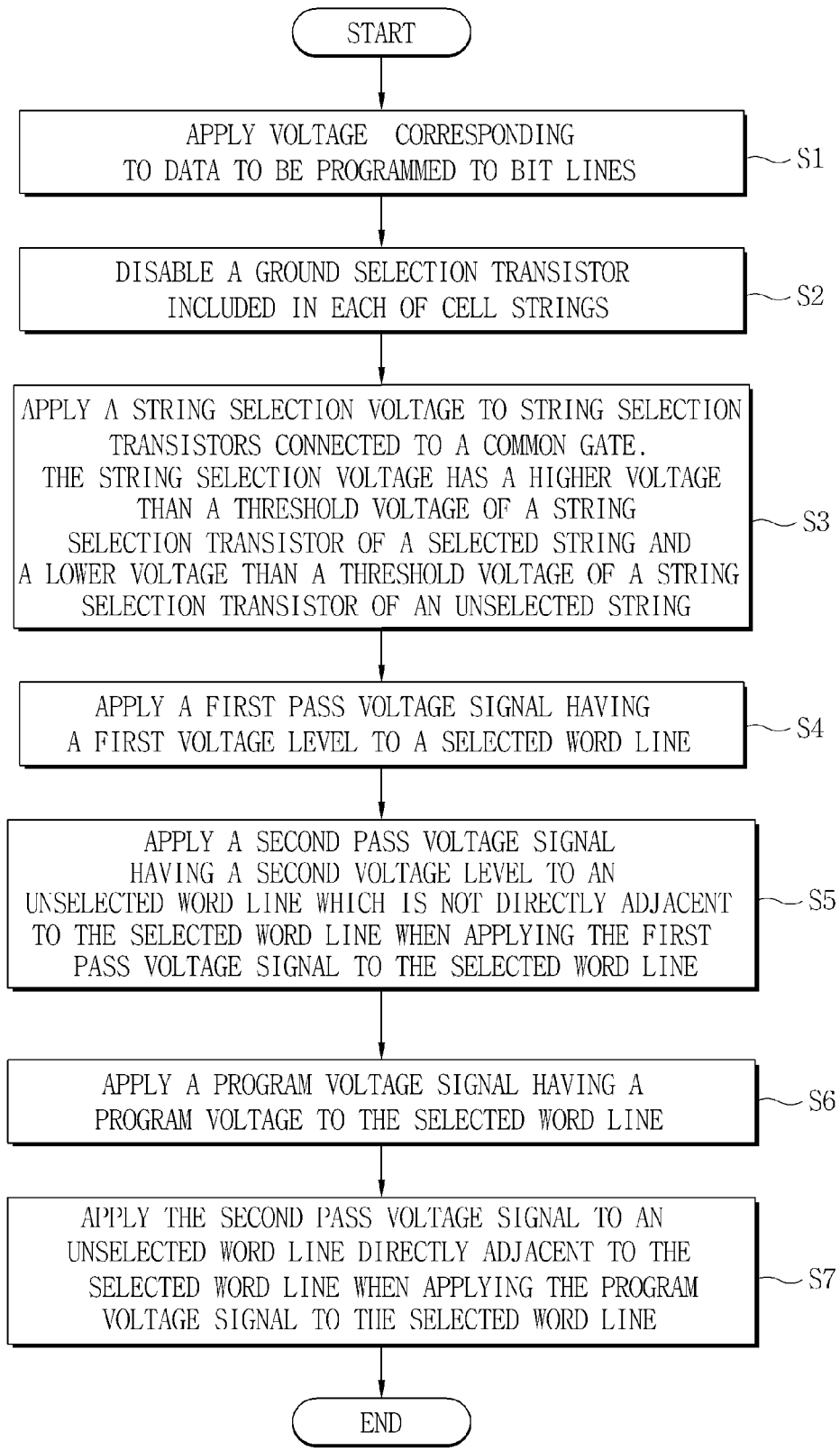

FIGS. 9 to 11 are flowcharts illustrating a method of programming a NAND-type flash memory device according to certain embodiments.

The NAND-type flash memory device may include a plurality of cell strings connected to corresponding bit lines and a plurality of word lines arranged parallel to each other in a direction perpendicular to the bit lines. Each of the cell strings may include a string selection transistor, a ground selection transistor having a first output terminal connected to a common source line, a plurality of cell transistors connected in series between the string selection transistor and the a second output terminal of the ground selection transistor.

Referring to FIG. 9, the method of programming the NAND-type flash memory device may include the following operations:

1) applying voltage corresponding to data to be programmed to bit lines (S1).

2) disabling a ground selection transistor included in each of cell strings (S2).

3) applying a string selection voltage to string selection transistors connected to a common gate, the string selection voltage having a higher voltage level than a threshold voltage of a string selection transistor of a selected string and a lower voltage level than a threshold voltage of a string selection transistor of an unselected string (S3).

4) applying a first pass voltage signal having a first voltage level to a selected word line (S4).

5) applying a program voltage signal having a program voltage level to the selected word line (S5).

6) applying a second pass voltage signal having a second voltage level to an unselected word line directly adjacent to the selected word line when applying the program voltage signal to the selected word line (S6).

Referring to FIG. 10, the method of programming the NAND-type flash memory device may include the following operations:

1) applying voltage corresponding to data to be programmed to bit lines (S1).

2) disabling a ground selection transistor included in each of cell strings (S2).

3) applying a string selection voltage to string selection transistors connected to a common gate, the string selection voltage having a higher voltage level than a threshold voltage of a string selection transistor of a selected string and a lower voltage level than a threshold voltage of a string selection transistor of an unselected string (S3).

4) applying a first pass voltage signal having a first voltage level to a selected word line (S4).

5) applying a program voltage signal having a program voltage level to the selected word line (S5).

6) applying a second pass voltage signal having a second voltage level to an unselected word line directly adjacent to the selected word line when applying the program voltage signal to the selected word line (S6).

7) applying the second pass voltage signal to an unselected word line which is not directly adjacent to the selected word line when applying the program voltage signal to the selected word line (S7).

Referring to FIG. 11, the method of programming the NAND-type flash memory device may include the following operations:

1) applying voltage corresponding to data to be programmed to bit lines (S1).

2) disabling a ground selection transistor included in each of cell strings (S2).

3) applying a string selection voltage to string selection transistors connected to a common gate, the string selection voltage having a higher voltage than a threshold voltage of a string selection transistor of a selected string and a lower voltage than a threshold voltage of a string selection transistor of an unselected string (S3).

4) applying a first pass voltage signal having a first voltage level to a selected word line (S4).

5) applying a second pass voltage signal having a second voltage level to an unselected word line which is not directly adjacent to the selected word line when applying the first pass voltage signal to the selected word line (S5).

6) applying a program voltage signal having a program voltage level to the selected word line (S6).

7) applying the second pass voltage signal to an unselected word line directly adjacent to the selected word line when applying the program voltage signal to the selected word line (S7).

In the above, a NAND-type flash memory device is mainly described, but embodiments of the inventive concept may be generally applied to a nonvolatile memory device including other types of nonvolatile memory devices, such as a magnetic RAM (MRAM) and a phase change RAM (PRAM).

Figure 12:
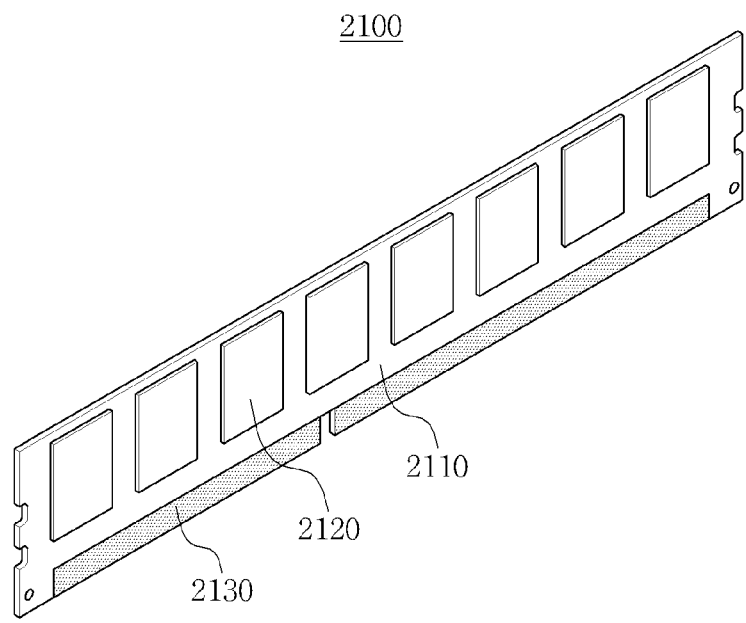
FIGS. 12 and 13 are diagrams of memory modules including a NAND-type flash memory device according to certain embodiments.
Figure 13:
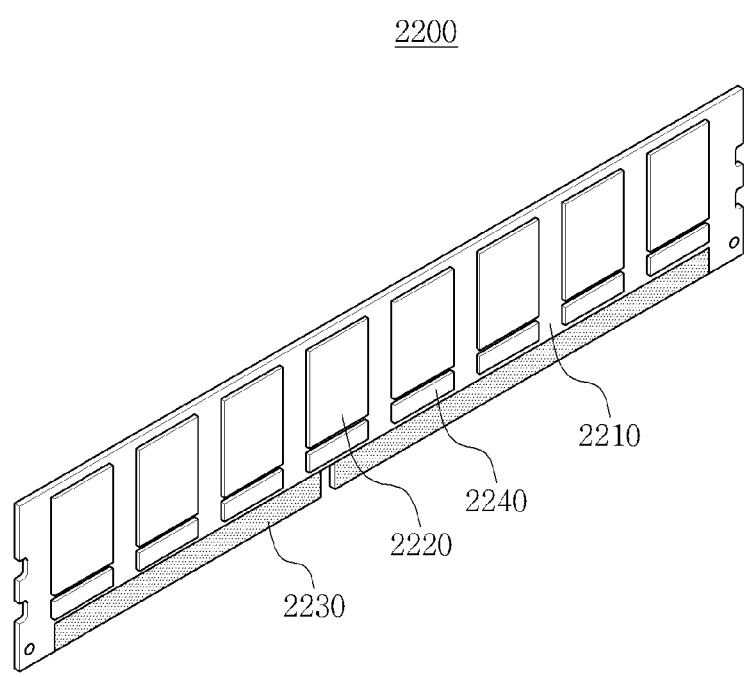

FIGS. 12 and 13 are diagrams of memory modules including a NAND-type flash memory device according to certain embodiments.

Referring to FIG. 12, the memory module 2100 may include a printed circuit board (PCB) 2110, a plurality of NAND-type flash memory devices 2120, and a connector 2130. The plurality of NAND-type flash memory devices 2120 may be bonded to top and bottom surfaces of the PCB 2110. The connector 2130 may be electrically connected to the plurality of NAND-type flash memory devices 2120 through conductive lines (not shown). Also, the connector 2130 may be connected to a slot of an external host.

Referring to FIG. 13, the memory module 2200 may include a PCB 2210, a plurality of NAND-type flash memory devices 2220, a connector 2230, and a plurality of buffers 2240. Each of the plurality of buffers 2240 may be disposed between the corresponding one of the NAND-type flash memory devices 2220 and the connector 2230.

The NAND-type flash memory devices 2220 and the buffers 2240 may be provided on top and bottom surfaces of the PCB 2210. The NAND-type flash memory devices 2220 and the buffers 2240 formed on the top and bottom surfaces of the PCB 2210 may be connected through a plurality of via holes.

Figure 14:
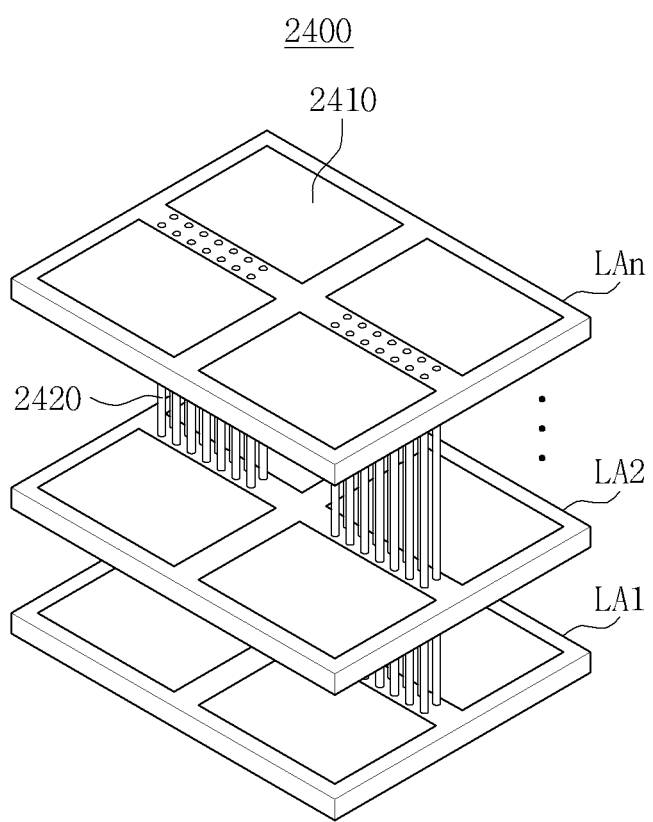
FIG. 14 is a simplified perspective view of a semiconductor device having a stack structure including a NAND-type flash memory device according to certain embodiments.

FIG. 14 is a simplified perspective view of a semiconductor device 2400 having a stack structure including a NAND-type flash memory device according to certain embodiments disclosed herein. In the memory modules 2100, 2200 of FIGS. 12 and 13, each of the NAND-type flash memory devices 2120 and 2220 may include a plurality of semiconductor layers LA1 to LAn.

In the stack semiconductor device 2400, the plurality of stacked semiconductor layers LA1 to LAn may be connected to one another through through-substrate vias (e.g., through-silicon vias) or TSVs 2420. Each of the semiconductor layers LA1 to LAn may include cell arrays 2410 including memory strings connected to bit lines.

Figure 15:
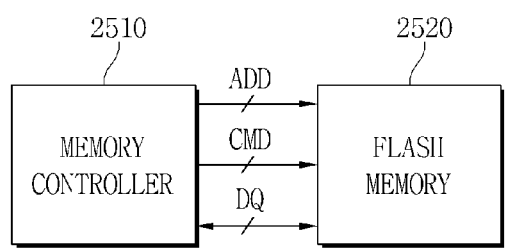
FIG. 15 is a block diagram of an example of a memory system including a NAND-type flash memory device according to certain embodiments.

FIG. 15 is a block diagram of an example of a memory system 2500 including a NAND-type flash memory device according to certain embodiments.

Referring to FIG. 15, the memory system 2500 may include a memory controller 2510 and a flash memory device 2520.

The memory controller 2510 may generate an address signal ADD and a command CMD, and provide the address signal ADD and the command CMD to the flash memory device 2520 through buses. Data DQ may be transmitted from the memory controller 2510 to the flash memory device 2520 through the buses, or transmitted from the flash memory device 2520 to the memory controller 2510 through the buses.

The flash memory device 2520 may be a flash memory device according to the embodiments disclosed herein. Therefore, a parasitic capacitance between the selected word line and the unselected word line directly adjacent to the selected word line may be decreased. Further, distribution of a threshold voltage according to locations of memory cells in the memory cell array becomes uniform. Accordingly, a program performance of the NAND-type flash memory device 2520 may be improved.

Figure 16:
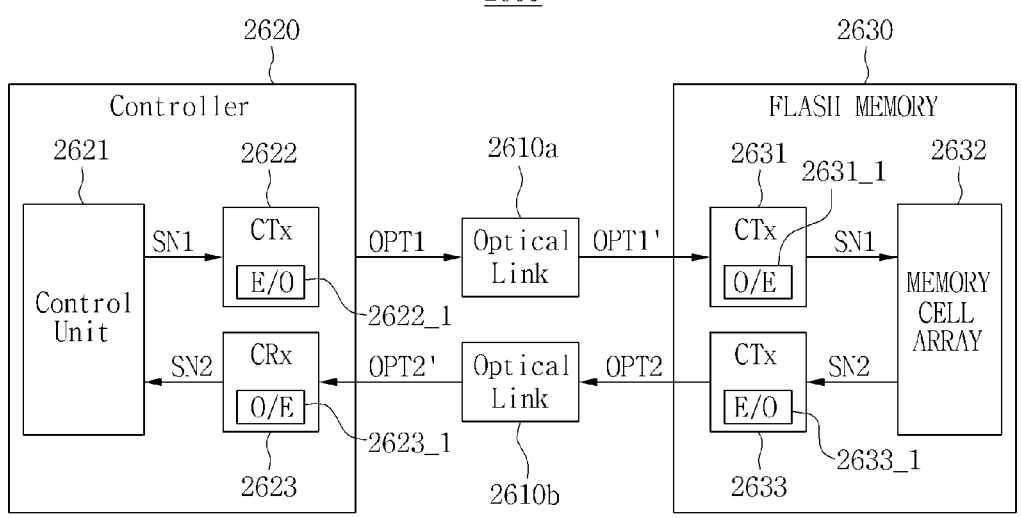
FIG. 16 is a block diagram of an example of a memory device including a NAND-type flash memory device and an optical link according to an embodiment.

FIG. 16 is a block diagram of an example of a memory system 2600 including a flash memory device and an optical link according to an embodiment.

Referring to FIG. 16, the memory system 2600 may include a controller 2620, a flash memory device 2630 according to the disclosed embodiments, and a plurality of optical links 2610a and 2610b configured to interconnect the controller 2620 and the flash memory device 2630. The controller 2620 may include a control unit 2621, a first transmitter 2622, and a first receiver 2623. The control unit 2621 may transmit a control signal SN1 to the first transmitter 2622.

The first transmitter 2622 may include a first optical modulator 2622_1, which may convert the control signal SN1, which is an electric signal, into a first optical transmission signal OPT1, and transmit the first optical transmission signal OPT1 to the optical link 2610a.

The first receiver 2623 may include a first optical demodulator 2623_1, which may convert a second optical receiving signal OPT2' received from the optical link 2610b into a data signal SN2, which is an electric signal, and transmit the data signal SN2 to the control unit 2621.

The flash memory device 2630 may include a second receiver 2631, a memory cell array 2632, and a second transmitter 2633. The second receiver 2631 may include a second optical modulator 2631_1, which may convert a first optical receiving signal OPT1' received from the optical link 2610a into the control signal SN1, which is the electric signal, and transmit the control signal SN1 to the memory cell array 2632.

In the memory cell array 2632, data may be written under the control of the control signal SN1, or the data signal SN2 output by the memory cell array 2632 may be transmitted to the second transmitter 2633.

The second transmitter 2633 may include a second optical modulator 2633_1, which may convert the data signal SN2, which is the electric signal, into a second optical data signal OPT2, and transmit the second optical data signal OPT2 to the optical link 2610b.

Figure 17:
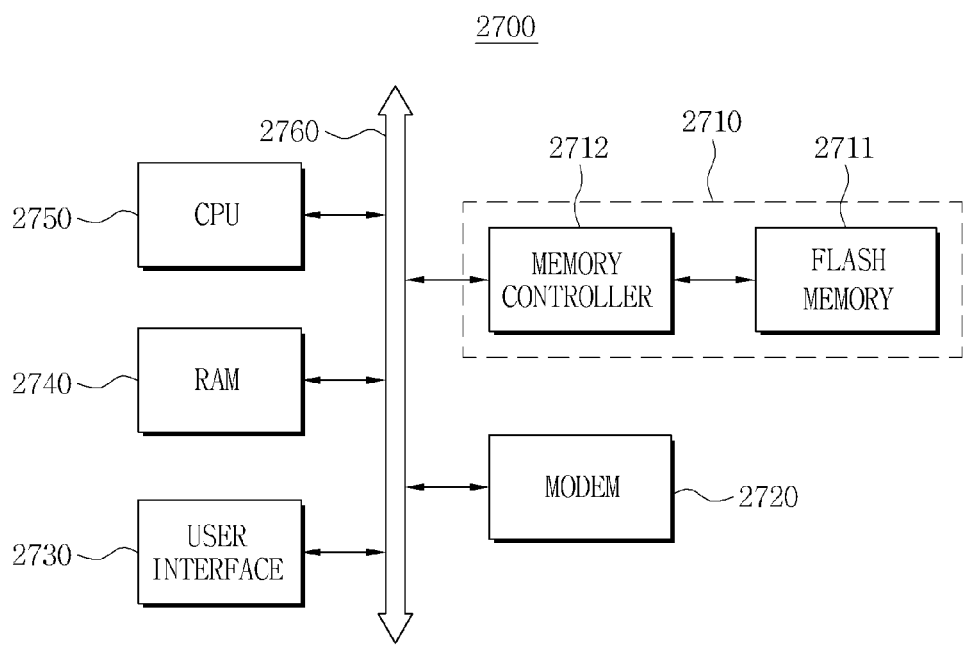
FIG. 17 is a block diagram of an example of an information processing system including a NAND-type flash memory device according to an embodiment.

FIG. 17 is a block diagram of an example of an information processing system including a NAND-type flash memory device according to an embodiment.

Referring to FIG. 17, a flash memory device 2711 may be mounted in a computer system, such as a mobile device or a desktop computer. The information processing system 2700 may include a memory system 2710, a modem 2720, a central processing unit (CPU) 2750, a RAM 2740, and a user interface 2730, which may be electrically connected to a system bus 2760.

The memory system 2710 may include the flash memory device 2711 and a memory controller 2712. Data processed by the CPU 2750 or externally input data may be stored in the flash memory device 2711.

The flash memory device 2711 may be a flash memory device according to the embodiments disclosed herein. Therefore, a parasitic capacitance between the selected word line and the unselected word line directly adjacent to the selected word line may be decreased. Further, distribution of a threshold voltage according to locations of memory cells in the memory cell array becomes uniform. Accordingly, a program performance of the NAND-type flash memory device 2711 may be improved.

Although not shown in FIG. 17, it would be apparent to those of ordinary skill in the art that an application chipset, a camera image processor (CIP), and an input/output (I/O) device may be further provided in the information processing system 2700.

Figure 18:
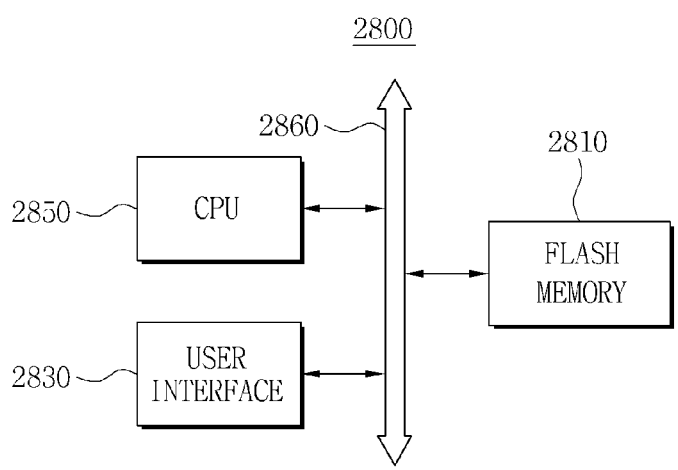
FIG. 18 is a block diagram of another example of an information processing system including a NAND-type flash memory device according to an embodiment.

FIG. 18 is a block diagram of another example of an information processing system including a NAND-type flash memory device according to an embodiment.

Referring to FIG. 18, a flash memory device 2810 may be mounted in a computer system 2800, such as a mobile device or a desktop computer. The computer system 2800 may include a flash memory device 2810, a CPU 2850, and a user interface 2830, which may be electrically connected to a system bus 2860.

The flash memory device 2810 may be a flash memory device according to the embodiments disclosed herein.

The disclosed embodiments may be applied to a nonvolatile memory device, and a memory system including the same.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A nonvolatile memory device, comprising:
    a memory cell array including a plurality of memory cells connected to word lines, string selection lines, ground selection lines arranged side by side in a row direction, and bit lines arranged in a direction perpendicular to the word lines; and
    a row control circuit configured to:
    generate a program voltage, a first pass voltage, and a second pass voltage;
    control the word lines, the string selection lines, and the ground selection lines; and
    apply the program voltage to a selected word line a predetermined time after the first pass voltage is applied to the selected word line, and apply the second pass voltage to an unselected word line directly adjacent to the selected word line when the program voltage is applied to the selected word line,
    wherein a voltage level of each of the first and second pass voltages is greater than a ground voltage level, and a voltage level of the program voltage is greater than those of the first and second pass voltages.

2. The device of claim 1, wherein the first pass voltage is part of a signal applied to the selected word line that includes a first rising time period, during which the voltage level of the selected word line reaches the first pass voltage,
    wherein the program voltage is part of the signal applied to the selected word line that includes a second rising time period, during which the voltage level of the selected word line reaches the program voltage,
    wherein the second pass voltage is part of a signal applied to the unselected word line directly adjacent to the selected word line that includes a third rising time period, during which the voltage level of the unselected word line directly adjacent to the selected word line reaches the second pass voltage, and wherein the second rising time period overlaps the third rising time period.

3. The device of claim 1, wherein the row control circuit is further configured to apply the second pass voltage to an unselected word line that is not directly adjacent to the selected word line when the program voltage is applied to the selected word line.

4. The device of claim 1, wherein the row control circuit is further configured to apply the second pass voltage to an unselected word line that is not directly adjacent to the selected word line when the first pass voltage signal is applied to the selected word line.

5. The device of claim 1, further comprising:
a page buffer circuit including page buffers corresponding to the respective bit lines, the page buffer circuit configured to sense data from a selected memory cell, output the sensed data in a read mode, and store input data in the program mode;
a column gate circuit configured to electrically connect or disconnect the page buffer circuit to or from an IO circuit; and
a common source line control circuit configured to control an electric potential of a common source line.

6. The device of claim 1, wherein the selected word line is a first word line, and the unselected word line is a second word line, and further comprising a third word line directly adjacent to the first word line, and
wherein the row control circuit is further configured to apply the second pass voltage to the third word line when the program voltage is applied to the first word line.

7. The device of claim 1, wherein the selected word line is a first word line, and the unselected word line is a second word line, and further comprising a third word line not directly adjacent to the first word line, and
wherein the row control circuit is further configured to apply the second pass voltage to the third word line when the program voltage signal is applied to the first word line.

8. The device of claim 1, wherein the selected word line is a first word line, and the unselected word line is a second word line, and further comprising a third word line not directly adjacent to the first word line, and
wherein the row control circuit is further configured to apply the second pass voltage to the third word line when the first pass voltage is applied to the first word line.

9. The device of claim 1, wherein the nonvolatile memory device is a stack memory device in which a plurality of layers configured to transmit and receive data and control signals through through-silicon vias (TSVs) are stacked.

10. A method of programming a nonvolatile memory device including a memory cell array that includes a plurality of memory cells connected to word lines, string selection lines, ground selection lines arranged side by side in a row direction, and bit lines arranged in a direction perpendicular to the word lines, the method comprising:
at a selected word line at a first time, transitioning to a first pass voltage having a first voltage level greater than a ground voltage;
at the selected word line at a second time, transitioning to a program voltage having a second voltage level greater than the first voltage level; and
at a first unselected word line directly adjacent to the selected word line at the second time, transitioning to a second pass voltage having a third voltage level greater than the ground voltage.

11. The method of claim 10, wherein the transitioning to the program voltage includes a first rising time period, the transitioning to the second pass voltage includes a second rising time period, and the first rising time period overlaps the second rising time period.

12. The method of claim 10, further comprising:
at a second unselected word line directly adjacent to the selected word line at the second time, transitioning to the second pass voltage,
wherein the selected word line is disposed between the first unselected word line and the second unselected word line.

13. The method of claim 10, further comprising:
transitioning the second pass voltage at a second unselected word line not directly adjacent to the selected word line when the program voltage is transitioned at the selected word line.

14. The method of claim 10, further comprising:
transitioning the second pass voltage at a second unselected word line not directly adjacent to the selected word line when the first pass voltage is transitioned at the selected word line.

15. A method of programming a nonvolatile memory device, the method comprising:
applying a first voltage greater than a ground voltage to a selected word line at a first time;
applying a second voltage greater than the first voltage to the selected word line at a second time that occurs after a predetermined period from the first time;
applying the ground voltage to a first unselected word line directly adjacent to the selected word line at the first time; and
applying a third voltage greater than the ground voltage to the first unselected word line at the second time.

16. The method of claim 15, wherein applying the second voltage to the selected word line includes a first rising time during which the voltage applied to the selected word line reaches the second voltage from the first voltage,
wherein applying the third voltage to the first unselected word line includes a second rising time during which the voltage applied to the first unselected word line reaches the third voltage from the ground voltage, and
wherein a portion of the first rising time and a portion of the second rising time overlap.

17. The method of claim 15, further comprising:
applying the ground voltage to a second unselected word line directly adjacent to the selected word line at the first time; and
applying the third voltage to the second unselected word line at the second time,
wherein the selected word line is disposed between the first unselected word line and the second unselected word line.

18. The method of claim 15, further comprising:
applying the ground voltage to a second unselected word line not directly adjacent to the selected word line at the first time; and
applying the third voltage to the second unselected word line at the second time.

19. The method of claim 15, further comprising:
applying the third voltage to a second unselected word line not directly adjacent to the selected word line at the first time.

* * * * *